(12) United States Patent
Sasaki et al.

(10) Patent No.: US 11,268,505 B2
(45) Date of Patent: Mar. 8, 2022

(54) ELECTRIC COMPRESSOR

(71) Applicant: IHI Corporation, Koto-ku (JP)

(72) Inventors: Yuji Sasaki, Koto-ku (JP); Takashi Yoshida, Koto-ku (JP); Tatsumi Inomata, Koto-ku (JP); Kuniaki Iizuka, Koto-ku (JP); Takuya Ozasa, Koto-ku (JP); Ryosuke Yumoto, Koto-ku (JP)

(73) Assignee: IHI Corporation, Koto-ku (JP)

( * ) Notice: Subject to any disclaimer, the term of this patent is extended or adjusted under 35 U.S.C. 154(b) by 254 days.

(21) Appl. No.: 16/327,384

(22) PCT Filed: Nov. 10, 2017

(86) PCT No.: PCT/JP2017/040593
§ 371 (c)(1),
(2) Date: Feb. 22, 2019

(87) PCT Pub. No.: WO2018/088525
PCT Pub. Date: May 17, 2018

(65) Prior Publication Data
US 2019/0195212 A1    Jun. 27, 2019

(30) Foreign Application Priority Data

Nov. 14, 2016    (JP) ............................. JP2016-221593

(51) Int. Cl.
*F04B 39/06*    (2006.01)
*F04B 39/12*    (2006.01)
(Continued)

(52) U.S. Cl.
CPC .............. *F04B 39/06* (2013.01); *F04B 35/04* (2013.01); *F04B 39/064* (2013.01); *F04B 39/12* (2013.01);
(Continued)

(58) Field of Classification Search
CPC ...... F04B 39/06; F04B 39/064; F04B 39/121; F04B 35/04; F04B 39/12; H05K 7/20927;
(Continued)

(56) References Cited

U.S. PATENT DOCUMENTS

| 6,166,937 A | 12/2000 | Yamamura et al. |
| 2003/0200761 A1 | 10/2003 | Funahashi et al. |

(Continued)

FOREIGN PATENT DOCUMENTS

| CN | 204835833 U | 12/2015 |
| JP | 11-346480 | 12/1999 |

(Continued)

OTHER PUBLICATIONS

International Search Report dated Feb. 6, 2018 in PCT/JP2017/040593, (with English translation), 4 pages.

*Primary Examiner* — Devon C Kramer
*Assistant Examiner* — David N Brandt
(74) *Attorney, Agent, or Firm* — Oblon, McClelland, Maier & Neustadt, L.L.P.

(57) ABSTRACT

An electric compressor includes a casing which accommodates an inverter and includes a bottom plate on which a power board of the inverter is mounted and a cooling water passage which is provided in a housing and opens to a bottom plate of the casing. The bottom plate of the casing includes a first surface on which a power board is mounted and a second surface opposite to the first surface. A metal plate is buried at a position corresponding to the power board in the bottom plate and a rear surface of the metal plate is exposed to the second surface side and faces the cooling water passage.

9 Claims, 5 Drawing Sheets

(51) Int. Cl.
*H05K 7/20* (2006.01)
*F04D 29/58* (2006.01)
*H02K 9/19* (2006.01)
*F04B 35/04* (2006.01)
*F04D 25/06* (2006.01)
*H02K 5/20* (2006.01)

(52) U.S. Cl.
CPC ............. *F04D 25/06* (2013.01); *F04D 29/58* (2013.01); *F04D 29/5813* (2013.01); *H02K 9/19* (2013.01); *H05K 7/20* (2013.01); *H02K 5/20* (2013.01)

(58) Field of Classification Search
CPC . H05K 7/20; H02M 7/48; F04D 29/58; F04D 29/5813; F04D 25/06; H02K 5/20; H02K 9/19
See application file for complete search history.

(56) References Cited

U.S. PATENT DOCUMENTS

| | | | |
|---|---|---|---|
| 2004/0028539 A1* | 2/2004 | Williams | F04D 29/5806 417/366 |
| 2005/0223727 A1 | 10/2005 | Funahashi et al. | |
| 2006/0064998 A1 | 3/2006 | Funahashi et al. | |
| 2007/0215316 A1* | 9/2007 | Saito | H02M 7/003 165/41 |
| 2007/0253164 A1* | 11/2007 | Matsuo | H01L 23/473 361/699 |
| 2008/0116838 A1 | 5/2008 | Hattori et al. | |
| 2013/0119834 A1* | 5/2013 | Nakagami | F04C 23/008 310/68 D |
| 2014/0232217 A1* | 8/2014 | Miyama | H02K 9/22 310/52 |
| 2015/0288258 A1 | 10/2015 | Hattori et al. | |
| 2016/0056683 A1 | 2/2016 | Nakanishi et al. | |
| 2017/0232831 A1* | 8/2017 | Agata | B60K 6/405 310/54 |
| 2018/0204784 A1* | 7/2018 | Kawase | H01L 25/18 |
| 2019/0238024 A1 | 8/2019 | Nakanishi et al. | |

FOREIGN PATENT DOCUMENTS

| | | |
|---|---|---|
| JP | 2003-101277 A | 4/2003 |
| JP | 2003-324903 A | 11/2003 |
| JP | 2007-20238 A | 1/2007 |
| JP | 2007-89258 A | 4/2007 |
| JP | 2008-128142 A | 6/2008 |
| JP | 2008-202477 A | 9/2008 |
| JP | 2010-110066 A | 5/2010 |
| JP | 2010-270760 A | 12/2010 |
| JP | 2011-067064 | 3/2011 |
| JP | 2012-92747 A | 5/2012 |
| JP | 2013-7390 A | 1/2013 |
| JP | 5178455 B2 | 4/2013 |
| JP | 2014-114725 A | 6/2014 |
| JP | 2015-90071 A | 5/2015 |
| KR | 10-2014-0084493 A | 7/2014 |
| WO | WO 2005/071824 A1 | 8/2005 |
| WO | WO 2015/188028 A2 | 12/2015 |
| WO | WO 2016/009133 A1 | 1/2016 |
| WO | WO 2016/012666 A1 | 1/2016 |

\* cited by examiner

ELECTRIC COMPRESSOR

TECHNICAL FIELD

The present disclosure relates to an electric compressor.

BACKGROUND ART

As inverters provided in motors of electric compressors or other motors, devices described in Patent Documents 1 to 9 are known. For example, the device described in Patent Document 1 is an electric compressor integrated with an inverter. The inverter is unitized in such a manner that a high voltage system component, a power system board, a control system board, a bus bar, and the like are assembled in a resin structure. A heat penetration portion formed of copper or the like is provided at a portion in which a power element of the power system board is installed. Meanwhile, an inverter accommodation portion is formed in an outer peripheral portion of a motor housing. The inverter is accommodated in the inverter accommodation portion. The heat penetration portion is in contact with a base surface of a motor housing and heat generated by the power element is radiated to the base surface. The base surface serves as a heat sink and cools the power element.

The device described in Patent Document 2 is an inverter power unit which drives a motor of a hybrid vehicle or an electric vehicle. In this device, a power device, a heat exchanger, a capacitor, and the like are inserted into an aluminum casing. The power device is in contact with a lower surface of the heat exchanger and the capacitor is in contact with an upper surface of the heat exchanger. A pipe is connected to the heat exchanger. The heat exchanger cools the power device and the capacitor in a water-cooled manner.

CITATION LIST

Patent Literature

Patent Document 1: Japanese Unexamined Patent Publication No. 2014-114725
Patent Document 2: Japanese Unexamined Patent Publication No. 2007-20238
Patent Document 3: International Publication WO 2015/188028
Patent Document 4: International Publication WO 2016/009133
Patent Document 5: International Publication WO 2016/012666
Patent Document 6: Japanese Unexamined Patent Publication No. 2012-92747
Patent Document 7: Japanese Unexamined Patent Publication No. 2003-324903
Patent Document 8: Japanese Unexamined Patent Publication No. 2007-89258
Patent Document 9: Japanese Unexamined Patent Publication No. 2008-128142

SUMMARY OF INVENTION

Technical Problem

In the related art, although there have been attempts to cool electric components (such as power boards) that generate heat, there is room for improvement in cooling performance. Further, it is an important issue to determine how much the inverter is cooled in an electric compressor provided with an inverter. The present disclosure will describe an electric compressor capable of improving the cooling performance of the inverter.

Solution to Problem

One embodiment of the present disclosure is an electric compressor having an inverter attached to a housing, including: a casing which accommodates the inverter and includes a bottom plate on which a power board of the inverter is mounted; and a cooling water passage which is provided in the housing and opens to the bottom plate of the casing. The bottom plate of the casing includes a first surface on which the power board is mounted and a second surface opposite to the first surface, and in which a metal plate is buried at a position corresponding to the power board in the bottom plate and a rear surface of the metal plate is exposed to the second surface side and faces the cooling water passage.

Effects of Invention

According to one embodiment of the present disclosure, the cooling efficiency of the inverter is improved.

DESCRIPTION OF EMBODIMENTS

Figure 1:
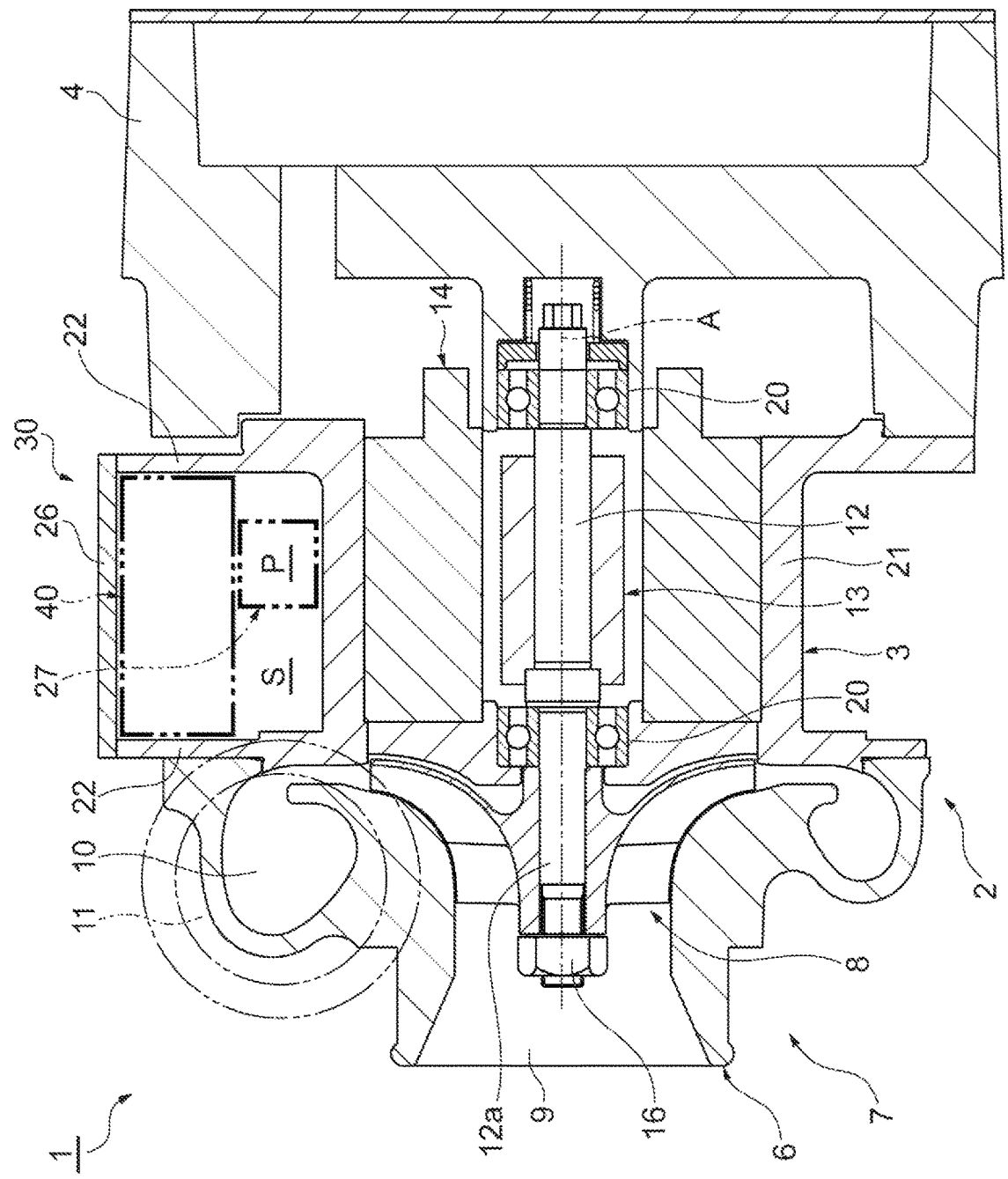
FIG. 1 is a cross-sectional view illustrating an electric compressor according to an embodiment of the present disclosure.

One embodiment of the present disclosure is an electric compressor having an inverter attached to a housing, including: a casing which accommodates the inverter and includes a bottom plate on which a power board of the inverter is mounted; and a cooling water passage which is provided in the housing and opens to the bottom plate of the casing. The bottom plate of the casing includes a first surface on which the power board is mounted and a second surface opposite to the first surface, and in which a metal plate is buried at a position corresponding to the power board in the bottom plate and a rear surface of the metal plate is exposed to the second surface side and faces the cooling water passage.

According to the electric compressor, the metal plate is buried at a position corresponding to the power board in the bottom plate of the casing. Since the rear surface of the metal plate is exposed to the second surface side of the bottom plate and faces the cooling water passage, heat generated in the power board is transmitted to the cooling water through the metal plate. Since it is possible to realize a configuration in which the cooling water is in contact with the rear surface of the metal plate, the power board can be effectively cooled. Accordingly, the cooling efficiency of the inverter is improved.

In some embodiments, the cooling water passage includes a first portion which is connected to an inlet of cooling water and a second portion which is connected to a downstream side of the first portion and is connected to an outlet of the cooling water and the rear surface of the metal plate faces both the first portion and the second portion. This configuration enables the rear surface of the metal plate to contact the cooling water at a plurality of positions based on the flow of the cooling water. Accordingly, the cooling efficiency of the inverter is further improved.

In some embodiments, the cooling water passage is integrally formed with an outer peripheral portion of the housing. This configuration enables the cooling water passage to contribute to the cooling of the heat radiation component including the stator portion inside the housing. For example, when the housing is provided with the second cooling water passage for cooling the heat radiation component, the second cooling water passage and the cooling water passage for the inverter may be connected to each other.

In some embodiments, the electric compressor further includes an inverter accommodation portion which is integrally formed with the outer peripheral portion of the housing and accommodates the casing and the inverter. This configuration enables the casing and the inverter which are unitized to be easily installed in the housing.

In some embodiments, a seal member is provided between the second surface of the bottom plate of the casing and a front end of a wall portion of the cooling water passage. This configuration enables to effectively prevent the cooling water inside the cooling water passage from leaking to the outside.

In some embodiments, the second surface of the bottom plate of the casing is provided with a protrusion portion which protrudes toward the cooling water passage and positions the casing with respect to the wall portion of the cooling water passage. This configuration ensures that the rear surface of the metal plate faces the cooling water passage.

In some embodiments, the metal plate is provided so that a front surface thereof is flush with the first surface of the bottom plate and the power board mounted on the first surface is in contact with the front surface of the metal plate. This configuration enables heat generated in the power board (that is, the inverter) to be effectively transmitted to the metal plate. As a result, the cooling efficiency of the inverter is further improved.

Hereinafter, an embodiment of the present disclosure will be described with reference to the drawings. Furthermore, in the description of the drawings, the same reference numerals are given to the same components and a repetitive description is omitted. In the following description, a "radial direction" is defined on the basis of a rotation axis A of a rotation shaft 12.

An electric compressor according to an embodiment will be described with reference to FIG. 1. An electric compressor 1 is applied to, for example, an internal combustion engine of a vehicle or a ship. The electric compressor 1 includes a compressor 7. The electric compressor 1 rotates a compressor impeller 8 by the interaction between a rotor portion 13 and a stator portion 14 to compress a fluid such as air and to generate compressed air.

The electric compressor 1 includes the rotation shaft 12 which is rotatably supported inside a housing 2 and the compressor impeller 8 which is fastened to a front end portion 12a of the rotation shaft 12. The housing 2 includes a motor housing 3 which accommodates the rotor portion 13 and the stator portion 14 and a base housing 4 which closes an opening at a second end side (at the right side of the drawing and the opposite side to the compressor impeller 8) of the motor housing 3. A compressor housing 6 which accommodates the compressor impeller 8 is provided at the first end side (at the left side of the drawing and the side of the compressor impeller 8) of the motor housing 3. The compressor housing 6 includes a suction port 9, a scroll portion 10, and a discharge port 11.

The rotor portion 13 is attached to a center portion of the rotation shaft 12 in the direction of the rotation axis A and includes one or plural permanent magnets (not illustrated) attached to the rotation shaft 12. The stator portion 14 is attached to an inner surface of the motor housing 3 to surround the rotor portion 13 and includes a coil portion (not illustrated). When an AC current flows to the coil portion of the stator portion 14, the rotation shaft 12 and the compressor impeller 8 rotate together about the rotation axis A by the interaction between the rotor portion 13 and the stator portion 14. When the compressor impeller 8 rotates, the compressor 7 sucks external air through the suction port 9, compresses air through the scroll portion 10, and discharges compressed air from the discharge port 11. The compressed air discharged from the discharge port 11 is supplied to the above-described internal combustion engine.

The electric compressor 1 includes two bearings 20 which rotatably support the rotation shaft 12 with respect to the housing 2. The bearing 20 supports the rotation shaft 12 with both ends thereof. The first bearing 20 is provided at an end portion on the side of the compressor impeller 8 in the motor housing 3. The second bearing 20 is provided in a portion protruding from the base housing 4 in the direction of the rotation axis A (the side of the compressor impeller 8). For example, the compressor impeller 8 is attached to the rotation shaft 12 by a shaft end nut 16 provided in the front end portion 12a of the rotation shaft 12.

Next, an attachment structure of an inverter 60 and a cooling structure of the inverter 60 of the electric compressor 1 will be described with reference to FIGS. 1, 2, and 3. As illustrated in FIGS. 2 and 3, the inverter 60 is unitized in the electric compressor 1. The inverter 60 is accommodated inside a casing 50. In other words, the electric compressor 1 includes an inverter unit 40 and the inverter unit 40 includes the casing 50 and the inverter 60 attached to the casing 50.

Figure 2:
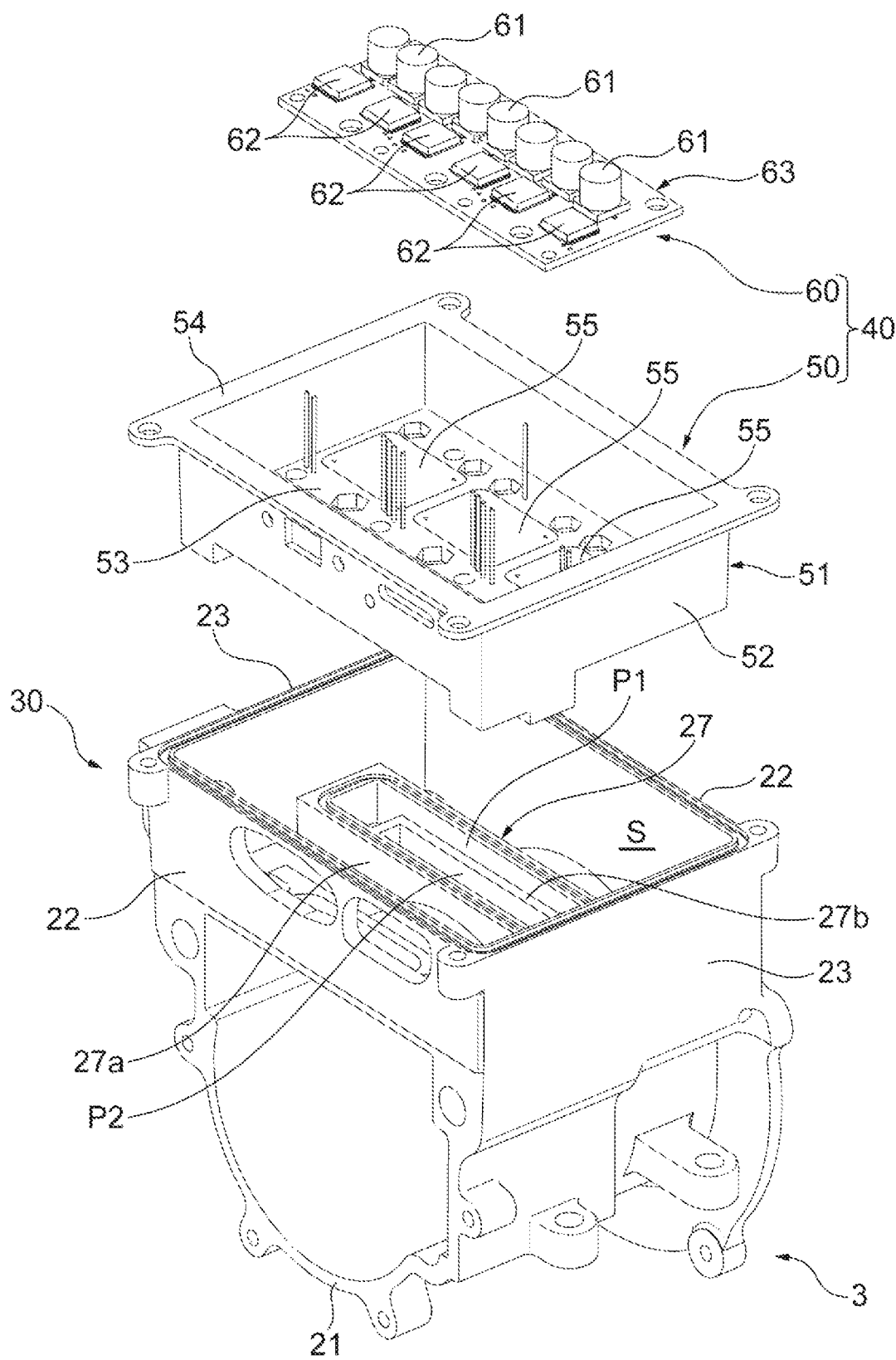
FIG. 2 is an exploded perspective view illustrating a housing and an inverter unit.
Figure 3:
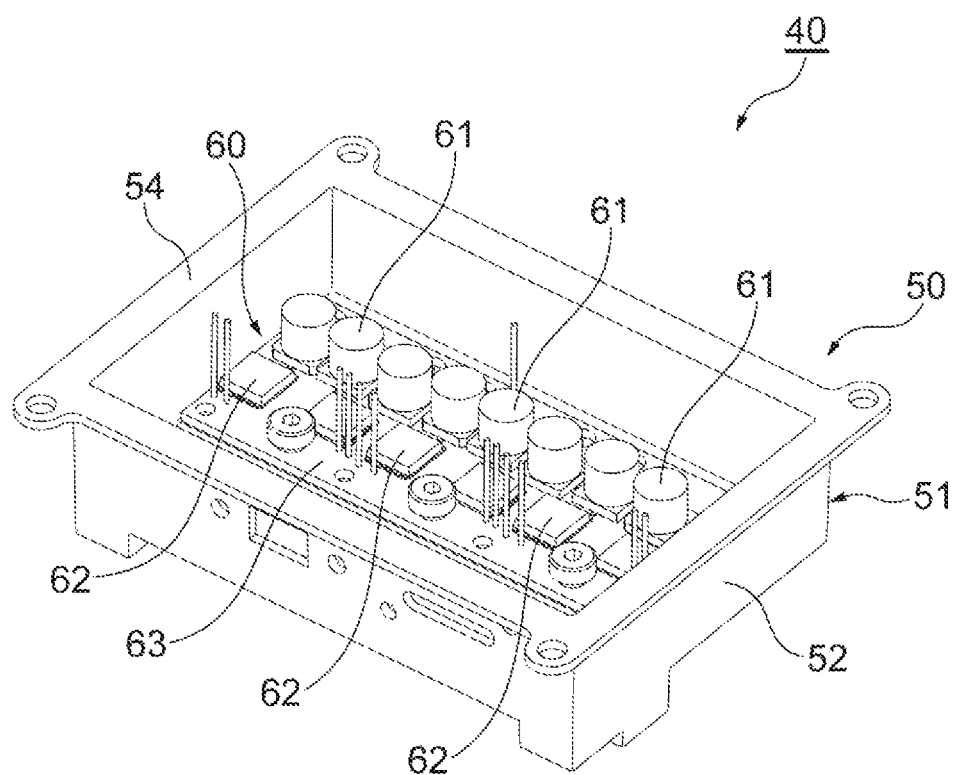
FIG. 3 is a perspective view illustrating the inverter unit.

As illustrated in FIGS. 1 and 2, the inverter unit 40 is attached to an outer peripheral portion of the motor housing 3. The motor housing 3 includes a cylindrical peripheral wall 21 and first and second outer walls 22 and 23 integrally formed with the outside of the peripheral wall 21. An inverter accommodation portion 30 which is a rectangular frame is formed by a pair of first outer walls 22 extending to be orthogonal to the direction of the rotation axis A and a pair of second outer walls 23 extending to be parallel to the direction of the rotation axis A. An accommodation space S is formed inside the inverter accommodation portion 30. In this way, the inverter unit 40 is accommodated in the inverter accommodation portion 30 integrally formed with the outer peripheral portion of the motor housing 3. The inverter unit 40 is disposed in the accommodation space S.

The motor housing 3, the compressor housing 6, and the base housing 4 are formed of, for example, aluminum. The peripheral wall 21, the first outer wall 22, and the second outer wall 23 are integrally formed of the same material and are formed of, for example, aluminum. The inverter accommodation portion 30 may include a cover 26 (see FIG. 1) covering openings formed at the outside of the first outer wall 22 and the second outer wall 23 in the radial direction.

The inverter accommodation portion 30 is provided with a cooling water passage 27 for cooling the inverter 60. In other words, a part of the accommodation space S is used as a cooling water passage space P. The cooling water passage 27 is integrally formed with the outside of the peripheral wall 21. The cooling water passage 27 is also formed of, for example, aluminum.

Figure 4:
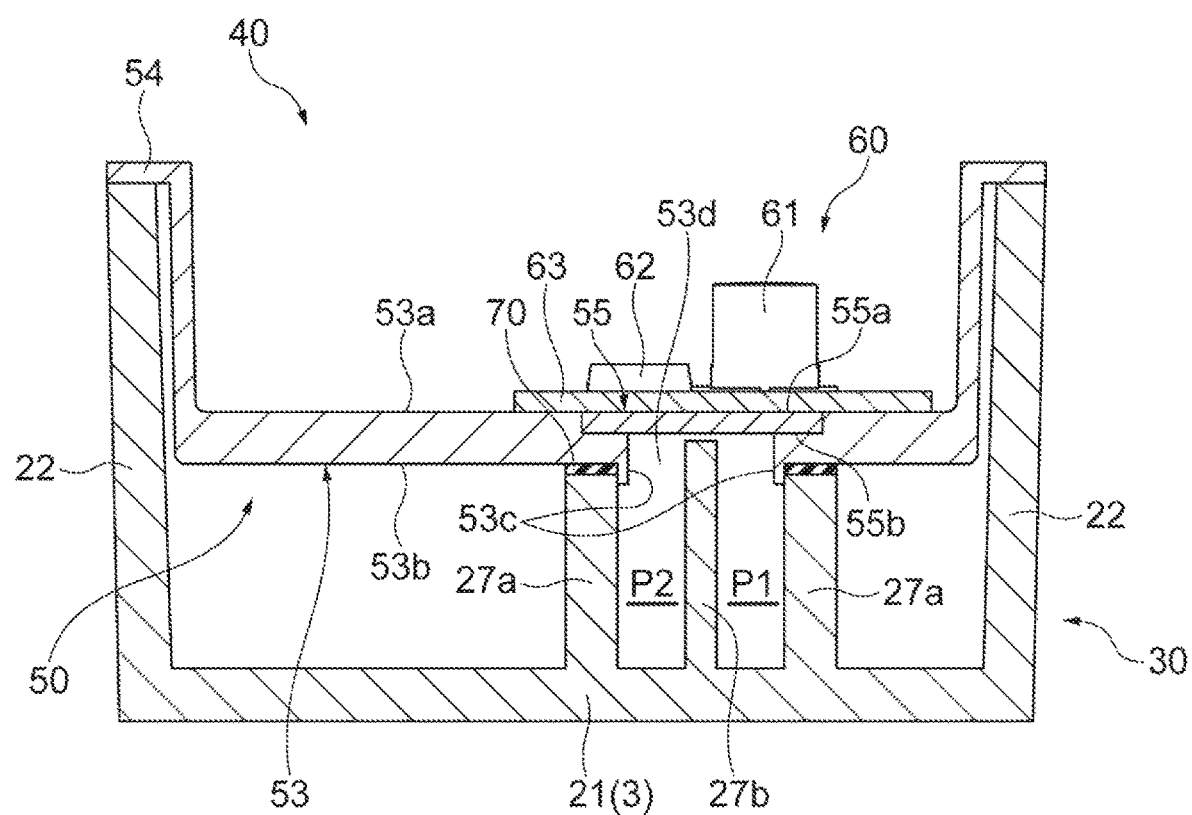
FIG. 4 is a cross-sectional view of the inverter unit.

As illustrated in FIGS. 2 and 4, the cooling water passage 27 is formed in a shape opening outward in the radial direction. The cooling water passage 27 includes an inlet and an outlet of the cooling water (not illustrated). The cooling water passage 27 includes a first portion P1 which is connected to the inlet of the cooling water and a second portion P2 which is connected to the downstream side of the first portion P1 and is connected to the outlet of the cooling water. The inlet and the outlet may be an opening provided in the peripheral wall 21 or a wall portion 27a or may be an end portion of a pipe provided separately.

These passages are formed by a partition portion 27b and the wall portion 27a integrally formed with the outside of the peripheral wall 21. The wall portion 27a and the partition portion 27b are provided to rise from the peripheral wall 21. The wall portion 27a is formed in a rectangular annular shape. The upper end (the front end) of the annular wall portion 27a is opened. The upper end of the wall portion 27a is located on the same plane. The plane may be a plane parallel to the rotation axis A.

The inlet, the outlet, the first portion P1, and the second portion P2 can be formed by appropriately disposing the wall portion 27a and the wall portion 27a. For example, a base end portion of the partition portion 27b is connected to one position of the annular wall portion 27a. The partition portion 27b is provided to extend inside the wall portion 27a. The inlet and the outlet can be provided at both sides of the base end portion of the partition portion 27b. Then, the first portion P1 and the second portion P2 are formed at both sides of the partition portion 27b extending inside the wall portion 27a. The shape and the size of the cooling water passage 27 can be appropriately changed in response to the capacity of the inverter 60, the size of the motor housing 3, or the like.

A second cooling water passage for cooling the stator portion 14, the bearing 20, or the like may be provided in the motor housing 3. For example, the second cooling water passage may be a water cooling jacket formed in the peripheral wall 21. The second cooling water passage may be connected to the inlet or the outlet of the cooling water passage 27. The electric compressor 1 can be provided with a pump for flowing cooling water to the cooling water passage 27 (and the second cooling water passage), a cooling water storage portion, or the like. The pump, the cooling water storage portion, or the like can be realized by the known technique.

The height of the wall portion 27a rising from the peripheral wall 21 is lower than the height of the first outer wall 22 (or the second outer wall 23). The inverter unit 40 is installed in a portion above the cooling water passage space P (outside in the radial direction) in the accommodation space S. In other words, the cooling water passage 27 is disposed below the inverter unit 40.

Next, the inverter unit 40 will be described. The casing 50 is formed of, for example, resin. As the material used in the casing 50, for example, PPS or the like can be exemplified. Here, the resin material used in the casing 50 is not particularly limited. A casing main body 51 of the casing 50 includes four side plates 52 and a bottom plate 53 connecting the lower ends of the side plates 52. The casing main body 51 which is a bottomed and rectangular frame opens outward in the radial direction.

A power board 63 of the inverter 60 is mounted on the bottom plate 53 of the casing main body 51. The power board 63 is an aluminum board. A control board (not illustrated) of the inverter 60 may be provided at the upper portion of the casing main body 51, that is, above the power board 63. A flange 54 is provided at the upper ends of four side plates 52. As illustrated in FIG. 4, a rectangle formed by the side plates 52 is slightly smaller than a rectangle formed by the first outer wall 22 and the second outer wall 23. The casing 50 fits in the inverter accommodation portion 30. The flange 54 is located at a position corresponding to the first outer wall 22 and the second outer wall 23 and covers the upper ends of the outer walls.

The bottom plate 53 includes a first surface 53a on which the power board 63 is mounted and a second surface 53b opposite to the first surface 53a. The second surface 53b of the bottom plate 53 faces the upper end (the front end) of the wall portion 27a. In other words, the cooling water passage 27 is opened toward the bottom plate 53. A seal member 70 is provided between the upper end of the wall portion 27a and the second surface 53b of the bottom plate 53. The seal member 70 is formed of, for example, rubber. The seal member 70 is formed in, for example, an annular shape throughout the entire upper end of the wall portion 27a and prevents the cooling water inside the cooling water passage 27 from leaking to the outside.

A metal plate 55 is buried at a position corresponding to the power board 63 in the bottom plate 53. The metal plate 55 is formed of, for example, aluminum. The metal plate 55 is buried in the bottom plate 53 of the casing main body 51 by, for example, insert-molding. The metal plate 55 is smaller than, for example, the power board 63. A region provided with the power board 63 includes a region provided with the metal plate 55. The power board 63 completely covers a front surface 55a of the metal plate 55.

The metal plate 55 is installed particularly at a position corresponding to a plurality of capacitors 61 and a plurality of metal-oxide-semiconductor field-effect transistors (MOSFETs) 62 provided on the power board 63. As viewed from a direction perpendicular to the front surface 55a of the metal plate 55, a region provided with the capacitor 61 and the MOSFET 62 is provided with the metal plate 55. In other words, a projection image obtained by projecting the capacitor 61 and the MOSFET 62 to the front surface 55a of the metal plate 55 in a perpendicular direction is located within the range of the metal plate 55. Furthermore, the position of the metal plate 55 with respect to the capacitor 61 and the MOSFET 62 may be slightly deviated. The capacitor 61 and the MOSFET 62 can be mentioned as a main heat radiation component of the inverter 60. The metal plate 55 may be located at a position in which heat generated from these components can be received. The above-described projection image may partially overlap the range of the metal plate 55.

More specifically, three metal plates 55 are provided to correspond to a three-phase AC circuit. Three metal plates 55 are arranged in series. The arrangement direction of the metal plates 55 matches the arrangement direction of the capacitor 61 and the MOSFET 62 and matches the extension direction of the cooling water passage 27 (the first portion P1 and the second portion P2). Each metal plate 55 corresponds to, for example, two MOSFETs 62 (see FIG. 2). Since three metal plates 55 are used, it is easy to solve a problem in which the metal plate 55 is bent as compared with a case in which one metal plate 55 is used. Furthermore, one metal plate 55 may be provided on the power board 63 to correspond to all capacitors 61 and all MOSFETs 62.

Figure 5:
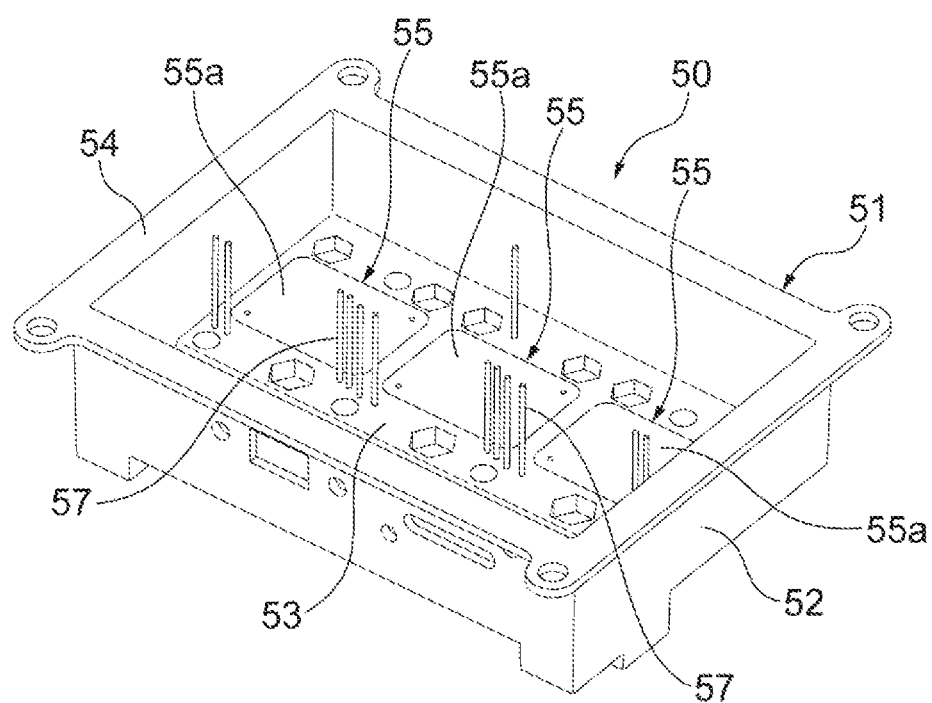
FIG. 5 is a perspective view illustrating a casing of the inverter unit.

The inverter unit 40 is also provided with a fastening member (such as a bolt or a nut) for attaching the power board 63 to the casing 50, a bus bar for supplying a current other than the above-described components, and the like. As illustrated in FIG. 5, the bottom plate 53 may be provided with a plurality of erected copper pins 57.

As illustrated in FIGS. 4 and 5, the metal plate 55 includes a front surface 55a and a rear surface 55b. The metal plate 55 is provided so that the front surface 55a is flush with the first surface 53a of the bottom plate 53. For example, the power board 63 mounted on the first surface 53a of the bottom plate 53 is in surface-contact with the front surface 55a of the metal plate 55.

Meanwhile, the bottom plate 53 is provided with an opening 53d formed on the side of the second surface 53b to correspond to a region in which the metal plate 55 is buried. The opening 53d communicates with the first portion P1 and the second portion P2 of the cooling water passage 27. Since the opening 53d is provided, the rear surface 55b of the metal plate 55 is exposed to the second surface 53b side and faces the first portion P1 and the second portion P2 (that is, the cooling water passage 27). Furthermore, the width of the metal plate 55 (the length of the power board 63 in the short edge direction illustrated in FIG. 4) is larger than the width of the opening 53d. The end portion of the metal plate 55 is located above the wall portion 27a. A thin portion of the bottom plate 53 and the seal member 70 are disposed between the end portion of the metal plate 55 and the wall portion 27a. The height of the partition portion 27b may be higher than the height of the wall portion 27a. The upper end of the partition portion 27b is disposed at the opening 53d and may be adjacent to the rear surface 55b of the metal plate 55.

A protrusion portion 53c which protrudes toward the cooling water passage 27 is provided at the peripheral edge portion of the opening 53d in the second surface 53b of the bottom plate 53. The protrusion portion 53c is disposed inside the wall portion 27a and guides the casing 50 when attaching the casing 50 to the inverter accommodation portion 30. In other words, the protrusion portion 53c positions the casing 50 with respect to the wall portion 27a of the cooling water passage 27. The protrusion portion 53c is a guide portion. One protrusion portion 53c may be continuously provided to extend along the wall portion 27a. The protrusion portion 53c may be provided at a plurality of positions along the wall portion 27a at intervals to be separated from each other.

The seal member 70 is disposed to be adjacent to the outside of the protrusion portion 53c. With the above-described configuration, the first portion P1 and the second portion P2 are formed as a space defined by the peripheral wall 21, the wall portion 27a, the partition portion 27b, the opening 53d (the protrusion portion 53c) of the bottom plate 53, and the rear surface 55b of the metal plate 55. The water tightness is improved by the seal member 70. The cooling water flowing through the cooling water passage 27 can be in contact with the peripheral wall 21, the wall portion 27a, the partition portion 27b, the protrusion portion 53c, and the rear surface 55b of the metal plate 55. The rear surface 55b of the metal plate 55 faces both the first portion P1 and the second portion P2. Accordingly, heat is efficiently exchanged between the heat radiation component of the inverter 60 and the cooling water through the metal plate 55.

According to the electric compressor 1 of the embodiment, the metal plate 55 is buried at a position corresponding to the power board 63 in the bottom plate 53 of the casing 50. Since the rear surface 55b of the metal plate 55 is exposed to the second surface 53b side of the bottom plate 53 and faces the cooling water passage 27, heat generated in the power board 63 is transmitted to the cooling water through the metal plate 55. Since it is possible to realize a configuration in which the cooling water is in contact with the rear surface 55b of the metal plate 55, the power board 63 can be efficiently cooled. Accordingly, the cooling efficiency of the inverter 60 is improved.

The rear surface 55b of the metal plate 55 faces both the first portion P1 and the second portion P2 of the cooling water passage 27. According to this configuration, the rear surface 55b of the metal plate 55 is in contact with the cooling water at a plurality of positions based on the flow of the cooling water. Accordingly, the cooling efficiency of the inverter 60 is further improved.

According to the inverter accommodation portion 30 integrally formed with the motor housing 3, the inverter unit 40 (the casing 50 and the inverter 60) can be easily installed in the motor housing 3.

According to the seal member 70, it is possible to effectively prevent the cooling water inside the cooling water passage 27 from leaking to the outside.

According to the protrusion portion 53c for positioning the casing 50, the rear surface 55b of the metal plate 55 reliably faces the cooling water passage 27.

According to the configuration in which the power board 63 is in contact with the front surface 55a of the metal plate 55, heat generated in the power board 63 (that is, the inverter 60) is efficiently transmitted to the metal plate 55. As a result, the cooling efficiency of the inverter 60 is further improved. Further, when the metal plate 55 is disposed at a plurality of positions to correspond to the plurality of power boards 63, it is not necessary to form the metal plate in a vertically elongated shape in accordance with the arrangement of the power boards 63, for example, as compared with a case in which one metal plate 55 is disposed to correspond to the plurality of power boards 63. The metal plate 55 has a thin plate shape. The vertically elongated shape easily causes the bent state of the metal plate. When the metal plate 55 is disposed as many as the power boards 63, the bent state of the metal plate 55 is suppressed and hence the contact area with the power board 63 can be increased. As a result, the cooling efficiency of the inverter 60 is improved.

According to the unitized inverter unit 40, the assembling property of the apparatus is improved.

Although the embodiment of the present disclosure has been described, the invention is not limited to the above-described embodiment. For example, the positioning protrusion portion 53c may be located at the outside of the wall portion 27a of the cooling water passage 27. The positioning protrusion portion may be omitted.

The seal member 70 may be omitted. Another structure for ensuring water tightness by preventing the leakage of the cooling water may be provided between the second surface 53b of the bottom plate 53 of the casing 50 and the front end of the wall portion 27a of the cooling water passage 27.

The present disclosure is not limited to a case in which the rear surface 55b of the metal plate 55 faces the upstream portion (the first portion P1) and the downstream portion (the second portion P2) of the cooling water passage 27 and the rear surface may face one position based on the flow of the cooling water.

The outer walls 22 and 23 (the inverter accommodation portion 30) which surround and accommodate the inverter unit 40 may be omitted. The cooling water passage may not be integrally formed with the outer peripheral portion of the motor housing 3 and the separately formed cooling water passage may be attached to the motor housing 3.

The present disclosure is not limited to a configuration in which the entirety of the front surface 55a of the metal plate 55 is in contact with the power board 63. A part of the front surface 55a of the metal plate 55 may be in contact with the power board 63. The metal plate 55 may be completely buried in the bottom plate 53 and the front surface 55a of the metal plate 55 may not be in contact with the power board 63 so as not to be exposed to the first surface 53a. For example, a part of the bottom plate 53 may exist as a thin plate shape between the front surface 55a of the metal plate 55 and the power board 63. When heat is transmitted through a thin plate-shaped resin portion, the power board 63 can be cooled.

The present disclosure is not limited to a case in which the casing 50 is formed of resin. The casing 50 may be formed of, for example, metal or the like.

INDUSTRIAL APPLICABILITY

According to some embodiments of the present disclosure, the cooling efficiency of the inverter is improved.

REFERENCE SIGNS LIST

1: electric compressor, 2: housing, 3: motor housing, 4: base housing, 6: compressor housing, 7: compressor, 8: compressor impeller, 12: rotation shaft, 13: rotor portion, 14: stator portion, 21: peripheral wall, 22: first outer wall, 23: second outer wall, 27: cooling water passage, 27a: wall portion, 30: inverter accommodation portion, 40: inverter unit, 50: casing, 51: casing main body, 52: side plate, 53: bottom plate, 53a: first surface, 53b: second surface, 53c: protrusion portion, 55: metal plate, 55a: front surface, 55b: rear surface, 60: inverter, 61: capacitor, 62: MOSFET, 63: power board, 70: seal member.

The invention claimed is:

1. An electric compressor having an inverter attached to a housing, the electric compressor comprising:
a rotor portion and a stator portion provided in the housing and configured to rotate a compressor impeller to compress a fluid;
a casing which accommodates the inverter, the casing including a bottom plate on which a power board of the inverter is mounted, the bottom plate including a plurality of openings and a plurality of step portions, each of the plurality of openings surrounded by one of the plurality of step portions;
a cooling water passage which is provided in the housing and opens to the bottom plate of the casing; and
a plurality of metal plates which are thinner than the bottom plate and are each mounted on a respective step portion of the plurality of step portions,
wherein the bottom plate of the casing includes a first surface on which the power board is mounted and a second surface opposite to the first surface,
wherein each of the plurality of metal plates are disposed between the power board and the respective step portion of the bottom plate, and
wherein a rear surface of each of the plurality of metal plates faces the cooling water passage through an opening of the plurality of openings.

2. The electric compressor according to claim 1, wherein the cooling water passage includes a first portion which is connected to an inlet of cooling water and a second portion which is connected to a downstream side of the first portion and is connected to an outlet of the cooling water, and
wherein the rear surface of each of the plurality of metal plates faces both the first portion and the second portion.

3. The electric compressor according to claim 1, wherein the cooling water passage is integrally formed with an outer peripheral portion of the housing.

4. The electric compressor according to claim 1, further comprising:
an inverter accommodation portion which is integrally formed with an outer peripheral portion of the housing and accommodates the casing and the inverter.

5. The electric compressor according to claim 1, wherein a seal member is provided between the second surface of the bottom plate of the casing and a front end of a wall portion of the cooling water passage.

6. The electric compressor according to claim 1, wherein the second surface of the bottom plate of the casing is provided with a protrusion portion which protrudes toward the cooling water passage and positions the casing with respect to a wall portion of the cooling water passage.

7. The electric compressor according to claim 1, wherein each of the plurality of metal plates are provided with a front surface, each front surface is flush with the first surface of the bottom plate, and the power board mounted on the first surface is in contact with each front surface of the plurality of metal plates.

8. The electric compressor according to claim 1, wherein the casing includes a flange and the housing includes an outer wall, and
the flange covers an upper end of the outer wall.

9. The electric compressor according to claim 4, wherein the casing includes a flange and the housing includes an outer wall, and
the casing is accommodated in the inverter accommodation portion and the flange covers an upper end of the outer wall.

* * * * *